(12) United States Patent
Durston et al.

(10) Patent No.: US 10,135,454 B2
(45) Date of Patent: Nov. 20, 2018

(54) OVERSAMPLING NOISE-SHAPING SUCCESSIVE APPROXIMATION ADC

(71) Applicant: Atlantic Inertial Systems Limited, Plymouth, Devon (GB)

(72) Inventors: Michael Terence Durston, Plymouth (GB); Kevin Townsend, Liskeard (GB); Douglas Robert Sitch, Plymouth (GB)

(73) Assignee: ATLANTIC INERTIAL SYSTEMS LIMITED, Plymouth, Devon (GB)

( * ) Notice: Subject to any disclaimer, the term of this patent is extended or adjusted under 35 U.S.C. 154(b) by 0 days.

(21) Appl. No.: 15/532,275

(22) PCT Filed: Dec. 3, 2015

(86) PCT No.: PCT/GB2015/053708
§ 371 (c)(1),
(2) Date: Jun. 1, 2017

(87) PCT Pub. No.: WO2016/087869
PCT Pub. Date: Jun. 9, 2016

(65) Prior Publication Data
US 2017/0346497 A1    Nov. 30, 2017

(30) Foreign Application Priority Data

Dec. 3, 2014  (GB) .................................. 1421481.1

(51) Int. Cl.
*H03M 1/06* (2006.01)
*H03M 1/08* (2006.01)
(Continued)

(52) U.S. Cl.
CPC ............. *H03M 1/08* (2013.01); *H03M 1/804* (2013.01); *H03M 1/462* (2013.01); *H03M 1/468* (2013.01)

(58) Field of Classification Search
CPC ...... H03M 1/403; H03M 1/462; H03M 1/804; H03M 1/468
(Continued)

(56) References Cited

U.S. PATENT DOCUMENTS 8,378,863 B2 *  2/2013  Ishikawa ................. H03M 1/00
                                                         341/118
2014/0176495 A1   6/2014  Vlasov

FOREIGN PATENT DOCUMENTS

WO    2004076340 A1    9/2004
WO    2005084351 A2    9/2005

OTHER PUBLICATIONS

Chen C-H et al: "Noise-shaping SAR ADC using three capacitors", Electronics Letters, I EE Stevenage, GB, vol. 49, No. 3, Jan. 31, 2013 (Jan. 31, 2013), pp. 182-184.
(Continued)

*Primary Examiner* — Khai M Nguyen
(74) *Attorney, Agent, or Firm* — Cantor Colburn LLP (57) ABSTRACT

A successive approximation Analog to Digital Converter (ADC), comprising: a sample and hold device arranged to sample and hold an input signal at the beginning of a conversion cycle; a successive approximation register that sequentially builds up a digital output from its most significant bit to its least significant bit; a digital to analog converter that outputs a signal based on the output of the successive approximation register; a comparator that compares the output of the digital to analog converter with an output of the sample and hold device and supplies its output to the successive approximation register; and a residual signal storage device arranged to store the residual signal at the end of a conversion cycle; and wherein the successive approximation ADC is arranged to add the stored residual signal from the residual signal storage device to the input signal stored on the sample and hold device at the start of each conversion cycle. After each ADC full conversion by the SAR, the analog conversion of the digital output is as close to the original input signal as the resolution will allow.

(Continued)

However there remains the residual part of the input signal that is smaller than what can be represented by the least significant bit of the digital output of the SAR. In normal operation, successive outputs of a SAR for the same input will result in the same digital value output and the same residual. By storing the residual at the end of each conversion and adding the residual onto the input signal of the next conversion the residuals are accumulated over time so that they may affect the output digital value. After a number of conversions, the accumulated residuals add up to more than the value represented by the LSB of the register and the digital value will be one higher than if a conversion had been performed on the input signal alone. In this way, the residual signal affects the output value in time and thus can be taken into account by processing the digital output in the time domain.

14 Claims, 3 Drawing Sheets

(51) Int. Cl.
*H03M 1/80* (2006.01)
*H03M 1/46* (2006.01)

(58) Field of Classification Search
USPC .......................................... 341/118, 163, 172
See application file for complete search history.

(56) References Cited

OTHER PUBLICATIONS

International Search Report and Written Opinion for Application No. PCT/GB2015/053708, dated Feb. 24, 2016, 16 Pages.
Jeffrey A Fredenburg et al: "A 90-MS/s 11-MHz-Bandwidth 62-dB SNDR Noise-Shaping SAR ADC", IEEE Journal of Solid-State Circuits, IEEE Service Center, Piscataway, NJ, USA, vol. 47, No. 12, Dec. 1, 2012 (Dec. 1, 2012), pp. 2898-2904
Rui-Feng Xue et al: "Ultra-low-power wireless implantable blood flow sensing microsystem for vascular graft applications", Integrated Circuits (ISIC), 2011 13th International Symposium on, IEEE, Dec. 12, 2011 (Dec. 12, 2011), pp. 224-229
Shahghasemi Mohsen et al: "An error-feedback noise-shaping SAR ADC in 90 nm CMOS", Analog Integrated Circuits and Signal Processing, Springer New York LLC, US, vol. 81, No. 3, Oct. 28, 2014 (Oct. 28, 2014), pp. 805-814.

* cited by examiner

OVERSAMPLING NOISE-SHAPING SUCCESSIVE APPROXIMATION ADC

CROSS REFERENCE TO RELATED APPLICATIONS

This is a US National Stage of Application No. PCT/GB2015/053708, filed on Dec. 3, 2015, which claims the benefit of GB Application No. 1421481.1 filed Dec. 3, 2014, the disclosures of which are incorporated herein by reference.

TECHNICAL FIELD

This disclosure relates to improved successive approximation analogue to digital converters, in particular to successive approximation converters with higher resolution leading either to greater accuracy or greater dynamic range, but maintaining low cost and small die area when implemented in an ASIC.

BACKGROUND

Successive approximation analogue to digital converters (ADCs) are one form of ADC that essentially performs a binary search across a range of signal values in order to match an input signal as closely as possible. Such ADCs are used in many electronic devices. One particular example where successive approximation ADCs are used to good effect is in sensors such as gyros and accelerometers, e.g. MEMS (micro electro-mechanical sensor) devices.

A MEMS accelerometer consists of a capacitive structure with interdigitated fingers connecting to suitable drive and pickoff electronics. Such devices can use either an open loop or a closed loop configuration. In open loop accelerometers the electronics are arranged to drive fixed electrodes with a sine or square wave signal and a proof mass moves under acceleration to provide a pickoff signal that is proportional to applied acceleration. WO 2004/076340 provides an example of an open loop accelerometer.

A similar or identical sensing structure can be used for closed loop operation by using drive electronics to provide a variable electrostatic force to the electrodes to provide force rebalancing. WO 2005/084351 provides an example of a closed loop electronic control circuit using pulse width modulation (PWM) of the drive signals.

In both the open loop configuration and the closed loop configuration it can be advantageous to convert the analogue pickoff output signal into the digital domain using an analogue to digital converter (ADC). In the open loop configuration this provides a digital signal that is proportional to acceleration and which can be used directly by the host system. In the closed loop configuration the conversion provides a digital signal that is proportional to the offset of the proof mass from the force rebalance null position, which can then be used with digital filtering to provide the required levels of drive electrostatic forces.

In both the open loop and the closed loop configuration it is desirable to have a high level of resolution and therefore a higher number of bits within the analogue to digital converter. In the open loop configuration the higher resolution allows the digital representation of the applied acceleration to be more accurate. In the closed loop configuration it allows the offset of the proof mass from the null position to be more accurately measured. The higher number of bits of the ADC is particularly beneficial where the dynamic range of the accelerometer is required to be large but it is still required to measure or control to a high degree of accuracy, e.g. down to below 100th of a g. For example if the required full scale operating range for the accelerometer is ±100 g, an ADC with only 10 bits will have a resolution of 0.2 g whereas an ADC with 14 bits will have a resolution of 0.012 g.

High ADC resolution is especially useful in systems when the random noise within the system is substantially smaller than the resolution of the ADC as the resolution will then directly influence the smallest signal that can be detected. This can be a problem for high dynamic range systems and can be partially solved by using a closed loop configuration to reduce the dynamic range required by the ADC. This however only works effectively providing the system is substantially linear (MEMS accelerometers are typically very nonlinear) and still requires ADC resolutions to be compatible with the resolution of the PWM system.

Monotonic behaviour is important for control systems. This means that an increase on the input should result in an increase on the output and a decrease on the input should result in a decrease on the output. In ADCs this means the avoidance of fluctuations on the output. In closed loop operation such non-monotonic fluctuations would reduce or destroy the stability of the feedback loop.

Achieving high resolution ADC converters with monotonic behaviour within an application specific integrated circuit (ASIC), which allows a fully integrated MEMS sensor to be achieved, is very difficult beyond 12 bits using standard techniques such as successive approximation (SAR) conversion. One option to achieve greater than 12 bits is to use a significant amount of trimming on each device. This is a calibration step that is performed after fabrication, whereby the individual on-chip elements of the converter are measured and adjusted so as to ensure the required monotonic operation. Trimming can be done mechanically, e.g. laser trimming can burn away small portions of resistors, or the trimming can be done electronically, e.g. by sub-dividing components and switching parts in and out of use during the trimming process to refine the final value. However these techniques add both significant area to the ASIC and cost through test time.

Another alternative for achieving higher resolution ADCs is to use sigma delta architecture ADCs. Sigma delta ADCs are normally single bit converters, although they may sometimes be multi-bit up to 3 or 4 bit. Sigma delta ADCs require significant over sampling with back end filtering to achieve high resolution converters. This requires a very high clock rate to allow the high oversampling. This in turn requires very careful design and layout to ensure that timing constraints are met. Also, a high order filter is required to convert the bit stream into the final digital value, adding latency to the signal path. High latency in the signal path reduces the loop bandwidth in a closed loop system, thus restricting the measurements. Low latency is desirable for use in dynamic systems where it is desired to measure accurately dynamic changes in the measured value, e.g. rapidly changing accelerations or gyro rates.

SUMMARY

According to this disclosure, there is provided a successive approximation Analogue to Digital Converter (ADC), comprising: a sample and hold device arranged to sample and hold an input signal at the beginning of a conversion cycle; a successive approximation register that sequentially builds up a digital output from its most significant bit to its least significant bit; a digital to analogue converter that outputs a signal based on the output of the successive approximation register; a comparator that compares the output of the digital to analogue converter with an output of the sample and hold device and supplies its output to the successive approximation register; and a residual signal storage device arranged to store the residual signal at the end of a conversion cycle; and wherein the successive approximation ADC is arranged to add the stored residual signal from the residual signal storage device to the input signal stored on the sample and hold device at the start of each conversion cycle.

After each ADC full conversion by the successive approximation register, i.e. after a full cycle from most significant bit to least significant bit, the analogue conversion of the digital output is as close as possible to the original input signal, i.e. as close as the resolution will allow. However there will still be a small difference between these two signals, being the residual part of the input signal that is smaller than what can be represented by the least significant bit of the digital output of the successive approximation register. In normal operation, successive outputs of a successive approximation register for the same input value will result in the same digital value output and the same residual, i.e. the digital value will always represent a slight underestimate or overestimate of the input signal (i.e. it is a systematic error). By storing the residual signal at the end of each conversion and adding the residual onto the input signal of the next conversion the residuals are accumulated over time so that they may affect the output digital value. If there is a lot of random noise in the system (e.g. greater than the value of the least significant bit), such accumulation can happen naturally, but the system described here does not rely upon such noise levels and can thus be used when there is low noise compared to the resolution. After a number of conversions, once the accumulated residuals add up to more than the value represented by the least significant bit of the register, the digital value will be one higher than if a conversion had been performed on the input signal alone. This "above-input" conversion reduces the residual again. In this way, the residual signal affects the output value in time and thus can be taken into account by processing the digital output in the time domain. For example, in a simple implementation averaging a number of successive digital output values provides a more accurate representation of the input signal, i.e. it can be used to add bits to the ADC conversion. Purely by way of example, averaging 8 successive outputs would add 3 bits of accuracy, while averaging 16 successive outputs would add 4 bits of accuracy.

This arrangement can make use of the fact that in most sensor devices the sensor itself is sampled at a higher frequency that the host system requires. For example the sensor device may sample a MEMS accelerometer at a sampling rate of 48 kHz, but filter the output to only 3 kHz for the host system. This allows time processing such as filtering or averaging of 16 successive samples for each data output to the host, hence an additional 4 bits of accuracy can be added. In this way, a typical 12-bit SAR ADC can be used as is currently typical, but the time processing of the residuals turns this into a 16-bit ADC. No additional trimming needs to be performed on the circuit (therefore reducing chip-area, cost and calibration time) and no high frequency clocks need to be added (as would be required for a sigma delta converter). The additional time domain processing that produces the extra accuracy does not add significantly to the cost or to the processing time (latency) as filters are already used on existing devices.

Accordingly, the successive approximation ADC may further comprise a time averaging device that averages its input values over time and outputs at a higher resolution than its input. The output resolution is thus higher than the resolution of the successive approximation register. The time averaging device may be a filter. For example, the time averaging device may be the filter already used as part of an accelerometer or gyro system to set the loop bandwidth, stability and high frequency noise rejection. In particularly preferred examples, it has been found that a second order filter is sufficient for these purposes. The time averaging device may provide its output at a lower rate than the conversion rate of the successive approximation register.

In some preferred examples, the sample and hold device is a capacitor. The input voltage can simply be applied to the capacitor to charge it up, then disconnected to hold the value. Similarly, the residual signal storage device may be a capacitor. While the residual signal could be taken directly from the main sample and hold capacitor at the end of the conversion process, the residual signal will typically be very small and so it is preferred to use an amplified version of the residual signal to charge the residual signal storage capacitor. The size of the residual signal storage capacitor relative to the input signal sample and hold capacitor can be chosen to compensate for the amplifier gain. Preferably the amplifier is part of the comparator that is used in the successive approximation conversion, thus saving on components and circuit area.

Preferably the successive approximation ADC is arranged to store the residual signal in a next clock cycle after the successive approximation register sets the least significant bit. The storage of the residual only takes a single clock cycle and this can be done in parallel with existing steps that transfer and capture the digital output, thus storing the residual does not add any clock cycle overhead to the process.

Additionally, only one extra clock cycle is required to add the residual onto the main sample and hold device, which is done between the sampling of the input signal and the first clock cycle of the SAR conversion. To compensate for this additional clock cycle and keep the total number of clock cycles the same as for a comparable existing (non-modulated) SAR, the final SAR output value is preferably latched into a register. The register can then be read by the other digital circuitry while the converter begins the next conversion cycle. Without this latching, the next conversion cycle cannot begin until the final conversion value has been read out. Allowing the final read out to be performed in parallel with the start of the next conversion saves another clock cycle to compensate for the additional residual sampling clock cycle mentioned above. Thus the total number of clock cycles is the same as for comparable existing SAR converters. This is particularly useful as it allows substitution of the new converter in place of previous converters without requiring significant redesign of other circuitry.

This disclosure also extends to a sensor device comprising: a sensor; a successive approximation ADC as set out above (optionally including any of the preferred or optional features also set out above); and a filter for time averaging the output of the successive approximation ADC. The sensor device may comprise an ASIC (Application Specific Integrated Circuit). The sensor device may be an accelerometer or a gyroscope. The techniques described here are particularly useful for MEMS accelerometers and gyroscopes or any system where the average (DC) performance is a key requirement, but minimal data latency (high bandwidth) is also required.

The techniques described above may be applied to either open loop or closed loop sensor configurations. In an open loop configuration, time domain processing and the corresponding resolution increase can be performed by the filter that would normally be used between the sensor and the host system. The technique finds particular benefit in closed loop systems and therefore preferably the output of the successive approximation ADC is fed back to a driver for driving the sensor. The time domain processing can be performed by a normal loop filter that ensures stability of the feedback loop. The increased resolution ADC value is fed back to the driver. Alternatively the time domain processing may be performed by an additional filter that filters on the output to the host system. As above, the filter may be a second order filter. Preferably the filter operates at a drive frequency of the sensor. This is a particularly convenient arrangement to make use of the existing clock signals that are already present in the system.

According to another aspect of this disclosure, there is provided a method of converting an analogue input signal to a digital value, the method comprising: sampling the input signal; adjusting the sampled input signal according to any stored residual signal from a previous conversion cycle; performing a successive approximation conversion on the input signal to provide a digital value representing the input signal, the digital value being such that when converted back to analogue, it is as close as possible to the input signal; comparing the analogue version of the final digital value and comparing it to the input signal to provide a residual signal indicative of the difference between the two; and storing said residual signal for a next conversion cycle.

All of the preferred features described above in relation to the system are equally applicable to this corresponding method. For example, the method may further comprise a step of averaging the output digital values of the successive approximation conversion over time to produce a higher resolution output. The residual signal may be stored in a next clock cycle after the last clock cycle of the successive approximation conversion.

BRIEF DESCRIPTION OF DRAWINGS

One or more non-limiting examples will now be described, by way of example only, and with reference to the accompanying figures in which.

Figure 1:
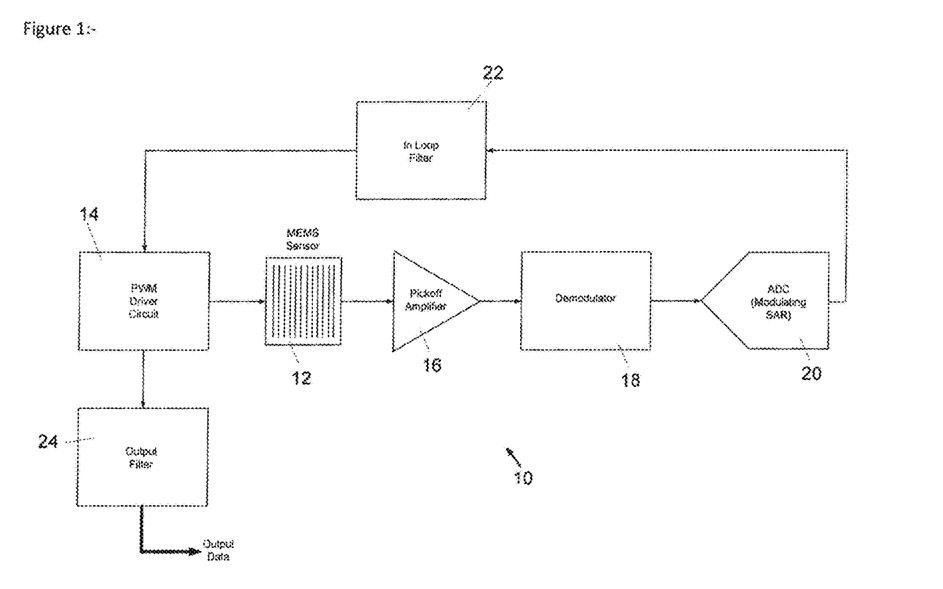
FIG. 1 shows a typical structure for a closed loop sensor arrangement.
Figure 2:
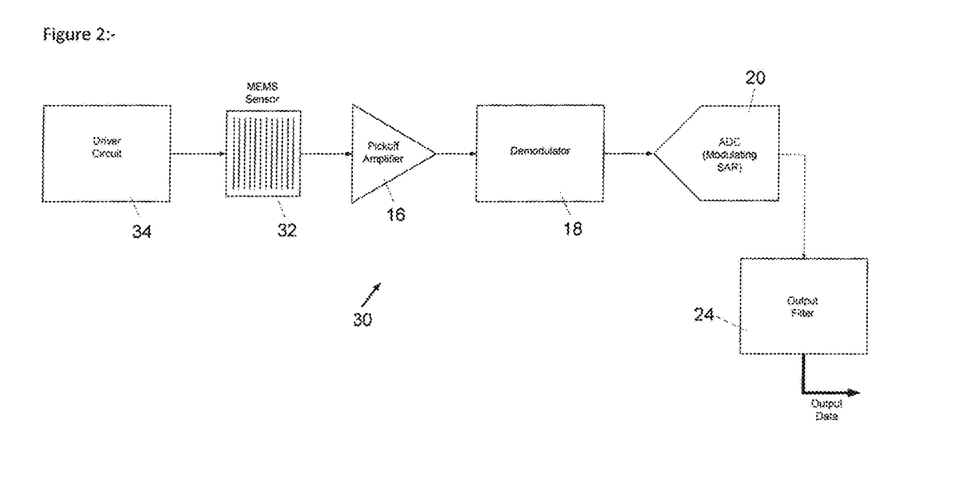
FIG. 2 shows a typical structure for an open loop sensor arrangement.

FIG. 1 shows a typical closed loop sensor accelerometer architecture with a 12 bit SAR converter and FIG. 2 shows a typical open loop sensor accelerometer architecture with a 12 bit SAR converter. The architectures shown in FIGS. 1 and 2 include the modulating SAR according to this disclosure, but are otherwise essentially the same as pre-existing architectures, but with a higher resolution output. Minor adaptations may be needed to the filters, e.g. to ensure that their internal registers have sufficient length for the increased resolution, but otherwise no changes are required to the operation of the filters. In some cases, e.g. where 16-bit registers have been used throughout as standard, no modification may be required.

In FIG. 1, closed loop sensor system 10 has a MEMS sensor 12 such as a linear accelerometer which is driven by PWM driver circuit 14. The driver circuit 14 applies a drive force to move a proof mass back towards its null position in a known fashion that will not be described further here. Pickoff amplifier 16 detects changes in the position of the proof mass and amplifies the signal to provide a signal indicative of the acceleration experienced by sensor 12. The signal applied to the sensor 12 is an AC signal and therefore demodulator 18 is used to remove the AC component, leaving a DC signal for ADC processing. Modulating SAR ADC 20 converts the analogue signal from the sensor into a digital value that is fed back through in-loop filter 22 which performs time domain processing of the signal before feeding it back to PWM driver circuit 14. The output signal is also taken from here and passed through an additional output filter 24 to the host system.

FIG. 2 shows an open loop sensor system 30. Amplifier 16, demodulator 18 and modulating SAR ADC 20 are the same as in FIG. 1. MEMS sensor 32 is not of the force rebalancing type of FIG. 1 and thus driver circuit 34 does not require a feedback signal. The output of modulating SAR ADC 20 is passed directly through output filter 24 which performs time domain processing before passing the output to the host system.

Figure 3A:
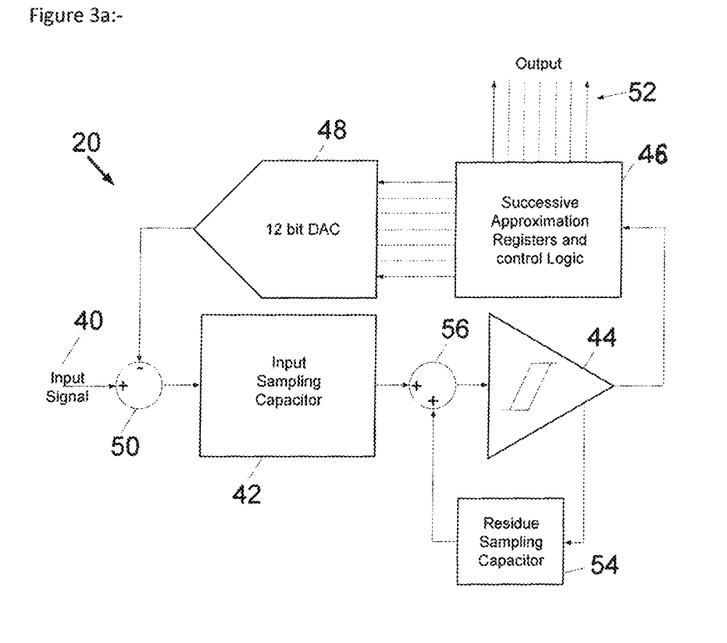
FIG. 3a schematically illustrates a successive approximation ADC with residue sampling and increased resolution.

FIG. 3a shows an architectural diagram of a modulated 12 bit SAR converter that takes into account the residual signal left over after each conversion cycle. The input signal 40 is fed into the sample and hold device 42 (in this example this is a sampling capacitor). The input signal 40 is sampled and held in sample and hold device 42 and the input signal is then disconnected while the SAR conversion takes place. Comparator 44 compares the stored input signal with the current approximation of the input signal that is produced by successive approximation register 46 and digital to analogue converter (DAC) 48. In FIG. 3a the output of DAC 48 is shown being inverted at 50 and fed back into sample and hold device 42 because the sample and hold device illustrated here is a sampling capacitor. The DAC 48 is essentially trying to balance the voltage stored on the capacitor. However it will be appreciated that in other examples the comparison could take place in any other suitable way.

The DAC output voltage is thus effectively compared to the input signal 40. The comparator output is dependent on the error between the DAC voltage and the input signal voltage. As the successive bits of the DAC are enabled by the successive approximation register and associated control logic 46, the comparator output level is used to determine whether that current DAC bit remains set or is reset before moving onto the next successive bit. The successive approximation register 46 begins at the most significant bit and progresses bit by bit towards the least significant bit, determining appropriate values for each in turn. At the end of the 12 bit successive approximation conversion the output logic value can be read at 52.

At this point, after a full conversion has been performed by the SAR 46, i.e. after all bit values have been suitably determined, the remaining error residue, i.e. the part of the input signal that was of lower magnitude than the least significant bit of the DAC, is sampled and held in residue sample and hold device 54 ready for the next conversion cycle. As discussed further below, the residue may be sampled from the comparator (in particular a first stage of the comparator in a multi-stage comparator), but any other suitable residue sampling method may be used.

On the next conversion cycle the input signal 40 is again sampled and held in sample and hold device 42 as before. However after the sampling of the input signal and just prior to the start of the successive approximation conversion the residue from residue sample and hold device 54 (i.e. the residue from the previous conversion) is used to modify the sampled input value held on sample and hold device 42, therefore slightly modifying the level by the previous conversion's sub-threshold error (the threshold being the value of the least significant bit). In FIG. 3*a* the residue from residue sample and hold device 54 is shown being added to the input sample and hold device 42 at 56, but it will be appreciated that any suitable alternative method of combining these values may be used so that both are taken into account in the conversion process.

At the end of this next conversion cycle (i.e. after another full pass through the bits of the DAC) the residue is again stored in residue sample and hold device 54, with the error becoming cumulative with previous residues. Eventually (after a number of conversion cycles) the error from the previous conversion reaches a level that causes the next conversion to flip the state of the least significant bit (compared with the state that would have resulted from conversion of the input signal alone). Over a period of a number of conversions the average value has a resolution higher than the raw (e.g. 12 bit) level of the converter.

Figure 3B:
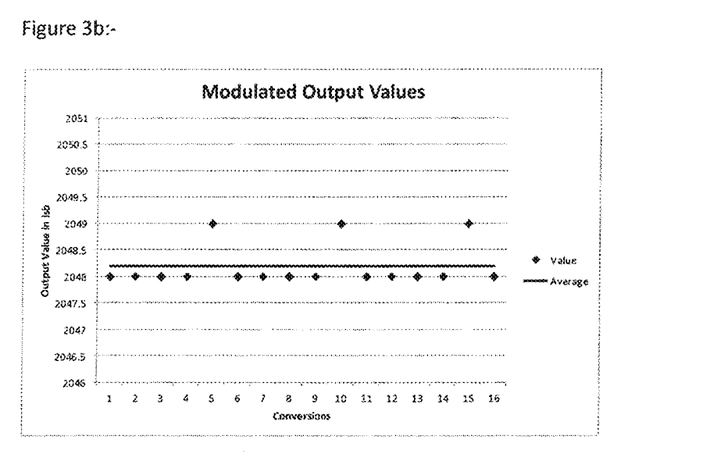
FIG. 3b shows an example of the successive approximation ADC with residue sampling output signal in the time domain.

As an example, the plot shown in FIG. 3*b* shows a sequence of sixteen conversions with values of 2048 and 2049 with the line indicating the average level of 2048.2 over the sixteen conversions. Thus the time-averaged value has a resolution greater than any of the individual values.

In one example, a 12 bit SAR converter developed for ASICs required 16 clock cycles to convert the applied signal. This was made up of 2 clock cycles to sample and hold the input signal, 12 clock cycles for the 12 bit SAR conversion and 2 clock cycles to allow for the transfer/capture of the converted digital number within the ASIC.

The modulated 12 bit SAR converter described above still only requires 16 clock cycles to convert the applied signal. This is achieved by latching the final converter digital value while simultaneously capturing the residue remaining from the conversion using one clock cycle after completion of the 12 bit SAR conversion. The second clock cycle after the completion of the 12 bit SAR conversion is therefore not required and is re-distributed to use for a clock cycle between sampling the input signal and the start of the SAR conversion to apply the held residue to the sampled input signal.

Figure 4:
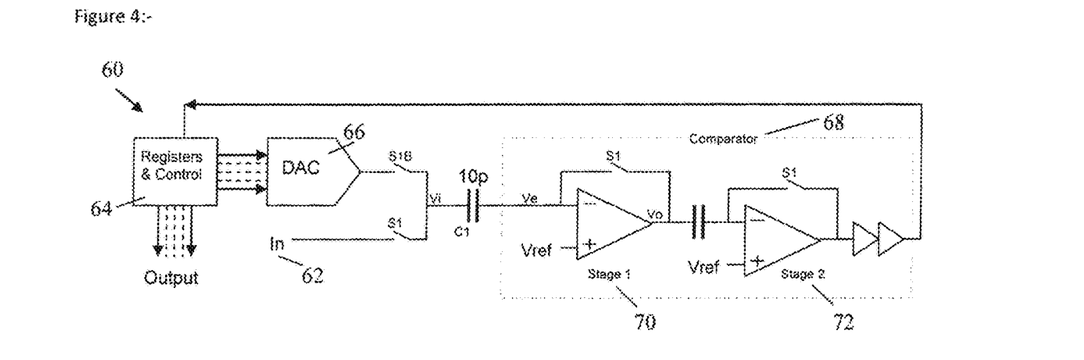
FIG. 4 shows a circuit for a basic successive approximation ADC.

FIG. 4 shows the architecture of an example of a standard 12 bit SAR converter 60 used in previous ASICs. The input signal 62 is applied to the sampling capacitor C1 when switches S1 are closed. When switches S1 are opened, C1 stores the value of the input signal 62 and the input signal 62 remains disconnected throughout the rest of the conversion. Switch S1B is then switched from open to closed while the SAR conversion takes place. The SAR conversion applies a voltage via the registers and controls 64 and the DAC 66 to the sampling capacitor C1, thus essentially trying to cancel the stored value on C1. The subsequent voltage Ve is then compared to the reference voltage (Vref) by the comparator 68. The comparator 68 in this example consists of two stages (first stage 70 and second stage 72) although this is not essential to operation. The output from the comparator 68 is then used by registers and controls 64 to determine the status of the bits of the output value during the SAR conversion. Registers and controls 64 progresses from the most significant bit down to the least significant bit in order, thus gradually building up a more accurate estimate of the input signal value stored on C1.

Figure 5:
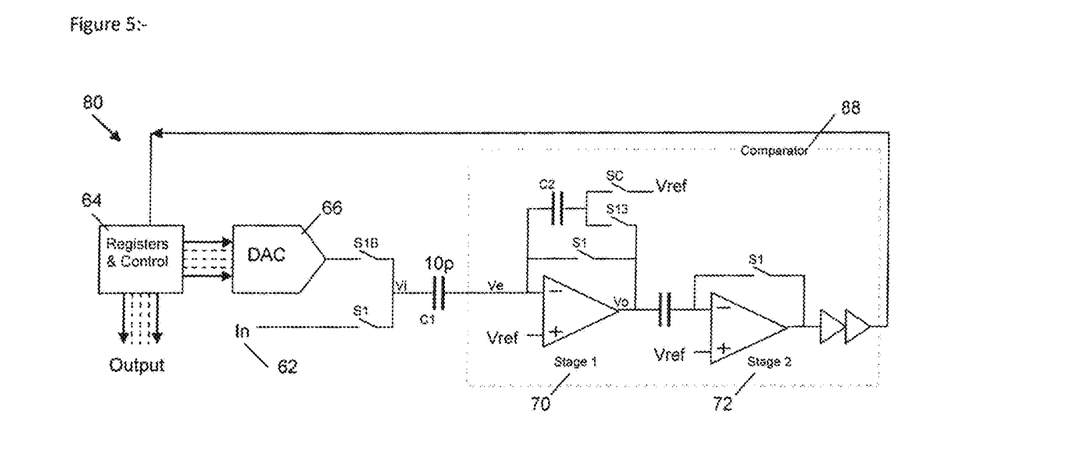
FIG. 5 shows a circuit for a successive approximation ADC with residue sampling and increased resolution.

FIG. 5 shows the architecture of an example of a modulating 12 bit SAR converter 80 that takes account of the residual signal from previous conversions and can thus be used to provide an output of increased resolution. The components of modulating converter 80 that are the same as those of the standard converter 60 are designated by the same reference numerals as those of the standard converter 60 of FIG. 4. The operation of this circuit is to a large extent the same as for the standard 12 bit SAR ADC 60 described above in relation to FIG. 4, but with the following exceptions. After the twelve clock cycles required for the SAR conversion, the next clock cycle is used to sample and hold the residue voltage (Ve) on the input to the first stage of the comparator 88. The residue voltage is sampled by capacitor C2 across the stage 1 comparator 70 by closing switch S13 (while S1, S1B and SC are all open). This restores Ve to the Vref voltage and creates an amplified residue voltage across C2, where the level of the amplification is determined by the ratio of the C2 capacitor to the C1 capacitor. During the start of the next conversion the input signal 62 is sampled with S1 closed as before. At this point the switches C13 and SC are both open to ensure that the stored residue charge on C2 does not get altered by the input voltage 62. After the sampling of the input signal 62 is complete the conversion process starts, S1 is opened to isolate the input signal 62 and S1B is closed to enable SAR conversion via DAC 66. Now SC is also closed which changes the voltage held on the capacitor C1 therefore affecting the current conversion. The charge stored on C2 is the same as required to move the voltage at the comparator input Ve back to a balanced condition for a given residue (i.e. Ve is shifted by the residue sampled from the previous conversion). This residue therefore accumulates over a number of conversions until the next least-significant-bit (LSB) threshold is reached; therefore modulating the ADC output code. Note that switch SC can be closed simultaneously with opening S1 and thus no additional clock cycle is required in order to add the stored residue back into the conversion.

When the modulated analogue to digital converter 80 is used in a closed loop architecture such as that shown in FIG. 1, the residue modulation coupled with performing conversions at the sensor loop operational frequency allows multiple conversions to be combined together along with some filtering applied to achieve greater than 14 bit resolution. The amount of additional resolution that can be added depends on the number of modulated SAR conversions that can be combined and thus depends on the required loop bandwidth and allowable loop latency.

One of the particular benefits of this modulation technique occurs when operating within a sensor system which operates at a carrier frequency significantly higher than required by either the closed loop overall response bandwidth or the open loop output data rate and bandwidth. The carrier frequency here is the frequency used to drive the sensor (i.e. the frequency of the drive circuits 14 or 34 in FIGS. 1 and 2) and thus also the sampling frequency of the pickup amplifier 16 that provides the input signal. The natural operation of the 12 bit modulated SAR at the carrier frequency allows simple filtering (which is already normally used within the sensor system) to be applied to the ADC output to enhance the overall system effective ADC resolution, without the necessity of adding in more complicated higher order filtering such as that normally associated with sigma delta converters. The arrangement can thus provide enhanced resolution without adding additional cost and complexity to the system.

When compared with a traditional higher resolution SAR converter (e.g. a straight 14 bit SAR converter), this system benefits by not requiring significantly extra chip area such as the 14-bit (or other high resolution) converter requires in order to implement the extra bits and trimming of the architecture to ensure monotonic behaviour.

One of the benefits of the above modulated SAR converter over sigma delta architectures is the significantly reduced clock speed. For example, if the modulated SAR ADC converts at 48 ksps (kilo-samples per second) which thus requires an internal clock of 768 kHz, a comparable one-bit sigma delta converter would require conversions at 1488 ksps which equates to a clock frequency of at least 1.5 MHz. Another of the benefits of the modulated SAR converter over sigma delta architectures is the simplicity of the filtering (i.e. the time domain processing). The sigma delta architecture requires significantly increased complexity of filtering, to apply high levels of attenuation of the high frequency noise created by the single bit conversion process (typically 4th order filtering or above), to achieve the required signal to noise ratio to allow the higher overall resolution.

The architecture of the modulated SAR converter utilises the operating frequency of the MEMS sensors by converting the pickoff sense signal at this frequency which is significantly higher than the overall required bandwidth of the sensor system. This allows the modulation to be applied and time averaged over a number of conversions of the ADC output so that the increased resolution is achieved, with minimal increase in chip area over the standard 12 bit SAR and without the necessity to trim the converter to achieve monotonic behaviour.

In the closed loop sensor operation the ADC output is normally passed through the loop filters, to create the correct bandwidth and loop stability, with the output being used to determine the required drive levels that are proportional to the applied acceleration. The architecture of the 12 bit modulator SAR converter such as that of FIG. 5 does not require the use of high order filters and therefore can use essentially the same filters that would be used for the closed loop sensor with a non-modulating SAR ADC. The use of the modulated 12 bit SAR converter can provide an effective resolution of greater than 14 bits.

In the open loop sensor the operation of the ADC is normally converting at the carrier frequency, but the required bandwidth for the host system is normally significantly less (typically less than a few kilohertz). Normally the (non-modulated) ADC output would be filtered by averaging over a number of conversions, In some implementations in which the noise is greater than 1 LSB, this can be used to provide some increase in resolution, e.g. to around 13 or 14 bits. However the use of the modulated 12 bit SAR such as that of FIG. 5 with very similar output filtration (less erroneous than required for a sigma delta converter) can increase this resolution to greater than 14 bits.

The systems and methods described above are preferably applied in systems with low noise, i.e. where the noise level is lower than the level of the least significant bit of the successive approximation register. The systems and methods described above are also particularly advantageous in systems which are inherently nonlinear so that random noise does not average to zero. The systems and methods are also particularly applicable where a wide dynamic range is required from the system.

The invention claimed is:

1. A successive approximation Analogue to Digital Converter (ADC), comprising:
a sample and hold device arranged to sample and hold an input signal at the beginning of a conversion cycle;
a successive approximation register that sequentially builds up a digital output from its most significant bit to its least significant bit;
a digital to analogue converter that outputs a signal based on the output of the successive approximation register;
a comparator that compares the output of the analogue to digital converter with an output of the sample and hold device and supplies its output to the successive approximation register; and
a residual signal storage device arranged to store a residual signal at the end of a conversion cycle; and
wherein the successive approximation ADC is arranged to add the stored residual signal from the residual signal storage device to the input signal stored on the sample and hold device at the start of each conversion cycle; and
wherein the successive approximation ADC further includes an output register arranged to latch the output of the successive approximation register.

2. A successive approximation ADC as claimed in claim 1, further comprising a time averaging device having an input, wherein the time averaging device averages its input values over time and outputs at a higher resolution than the input.

3. A successive approximation ADC as claimed in claim 2, wherein the time averaging device is a filter.

4. A successive approximation ADC as claimed in claim 1, wherein the sample and hold device comprises a capacitor.

5. A successive approximation ADC as claimed in claim 1, wherein the residual signal storage device is a capacitor.

6. A successive approximation ADC as claimed in claim 1, wherein the ADC is arranged to store the residual signal in a next clock cycle after the successive approximation register sets the least significant bit.

7. A sensor device comprising:
a sensor;
a successive approximation ADC; and
a filter for time averaging the output of the successive approximation ADC;
wherein the sensor is an accelerometer or a gyroscope; and
wherein the successive approximation ADC comprises:
a sample and hold device arranged to sample and hold an input signal at the beginning of a conversion cycle;
a successive approximation register that sequentially builds up a digital output from its most significant bit to its least significant bit;
a digital to analogue converter that outputs a signal based on the output of the successive approximation register;
a comparator that compares the output of the analogue to digital converter with an output of the sample and hold device and supplies its output to the successive approximation register; and
a residual signal storage device arranged to store a residual signal at the end of a conversion cycle;
wherein the successive approximation ADC is arranged to add the stored residual signal from the residual signal storage device to the input signal stored on the sample and hold device at the start of each conversion cycle.

8. A sensor device as claimed in claim 7, wherein the output of the successive approximation ADC is fed back to a driver for driving the sensor.

9. A sensor device as claimed in claim 7, wherein the filter is a second order filter.

10. A sensor device as claimed in claim 7, wherein the filter operates at a drive frequency of the sensor.

11. A method of converting an analogue input signal to a digital value, the method comprising:
   sampling the input signal;
   adjusting the sampled input signal according to any stored residual signal from a previous conversion cycle;
   performing a successive approximation conversion on the input signal to provide a digital value representing the input signal, the digital value being such that when converted to back to analogue, it is as close as possible to the input signal;
   comparing the analogue version of the final digital value and comparing it to the input signal to provide a residual signal indicative of the difference between the two; and
   storing said residual signal for a next conversion cycle.

12. A method as claimed in claim 11, further comprising a step of averaging the output digital values of the successive approximation conversion over time to produce a higher resolution output.

13. A method as claimed in claim 11, wherein the residual signal is stored in a next clock cycle after the last clock cycle of the successive approximation conversion.

14. A successive approximation Analogue to Digital Converter (ADC), comprising:
   a sample and hold device arranged to sample and hold an input signal at the beginning of a conversion cycle;
   a successive approximation register that sequentially builds up a digital output from its most significant bit to its least significant bit;
   a digital to analogue converter that outputs a signal based on the output of the successive approximation register;
   a comparator that compares the output of the analogue to digital converter with an output of the sample and hold device and supplies its output to the successive approximation register; and
   a residual signal storage device arranged to store a residual signal at the end of a conversion cycle;
   wherein the successive approximation ADC is arranged to add the stored residual signal from the residual signal storage device to the input signal stored on the sample and hold device at the start of each conversion cycle;
   wherein the ADC is arranged to store the residual signal in a next clock cycle after the successive approximation register sets the least significant bit.

* * * * *